United States Patent [19]

Gentry, Jr. et al.

[11] 4,274,052
[45] Jun. 16, 1981

[54] CURRENT METER USING CORE SATURATION

[75] Inventors: James H. Gentry, Jr., New Monmouth; Gilbert J. Stiles, Sr., Wayside, both of N.J.

[73] Assignee: Bell Telephone Laboratories, Incorporated, Murray Hill, N.J.

[21] Appl. No.: 65,947

[22] Filed: Aug. 13, 1979

[51] Int. Cl.³ .................. G01R 33/00; G01R 1/20
[52] U.S. Cl. ........................ 324/117 R; 324/127; 324/254
[58] Field of Search .............. 324/127, 98, 117 R, 324/251, 254, 117 H

[56] References Cited

U.S. PATENT DOCUMENTS

| | | | |
|---|---|---|---|
| 1,825,514 | 9/1931 | Fitzgerald | 324/98 |
| 2,053,154 | 9/1936 | La Pierre | 324/117 R |
| 2,272,772 | 2/1942 | Hathaway | 324/127 |
| 2,836,791 | 5/1958 | Kaplan | 324/117 R |
| 3,007,106 | 10/1961 | Bergh et al. | 324/117 R |

OTHER PUBLICATIONS

Model 428D Oper. and Ser. Manual; Sep. 1963; Hewlett-Packard Co., Palo Alto, Calif.

*Primary Examiner*—Ernest F. Karlsen
*Attorney, Agent, or Firm*—Richard J. Roddy

[57] ABSTRACT

It is known for current meters to operate by sensing the magnetic field produced by the unknown current being measured. Such meters may include a core (200-1) of magnetic material which may be opened to receive a current carrying conductor (400-1) and which is adapted to be coupled to the magnetic fields surrounding the conductor. Winding (300-1), placed around the core, is excited at a fundamental frequency as supplied by an ac source (110). Responsive thereto, an output voltage of twice or higher even harmonics of the exciting frequency is produced. The output voltage is proportional to the magnetic flux produced by the current being measured and hence may be extended through a meter for indicating the unknown current. Such arrangements tend to be expensive. The instant current meter (100) includes an arrangement for providing a dc current (190) through the core winding to neutralize the nonsymmetry of the magnetic field created by the unknown current. The neutralizing mitigates the detected second harmonic (120, 130, 140). When the second harmonic is minimized, the core winding dc current (170) equals the unknown conductor current.

2 Claims, 1 Drawing Figure

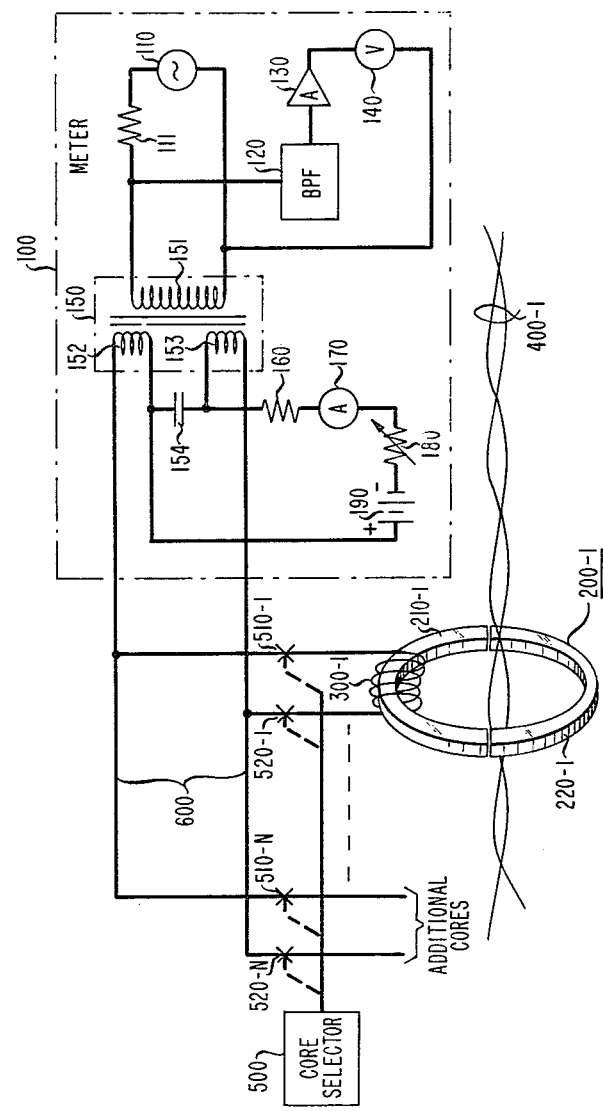

CURRENT METER USING CORE SATURATION

TECHNICAL FIELD

This invention relates to current meters and, more particularly, to a current meter which measures current by measuring the magnetic field set up by the current.

BACKGROUND OF THE INVENTION

Current is usually measured either directly with the use of a moving coil type current meter or indirectly by measuring the voltage drop across a known resistance. Each of these methods has disadvantages.

U.S. Pat. No. 3,007,106; entitled "Current Meter and Probe Therefor" and issued Oct. 31, 1961; discloses current measuring arrangement, one which uses a bridge circuit and which operates by sensing the magnetic field produced by the current being measured. The arrangement includes a core of magnetic material which can be opened to receive a current carrying conductor and which is adapted to be coupled to the magnetic fields surrounding the conductor. Windings, placed around the core, are excited at a fundamental frequency as provided by an ac source. Responsive thereto, an output voltage of twice or higher even harmonics of the exciting frequency is produced at an output of a bridge circuit. The output voltage is proportional to the magnetic flux produced by the current being measured. Hence, the output voltage may be extended through an amplifier to a phase sensitive detector whose output, in turn, feeds a current indicating galvonometer type device. The overall arrangement is stabilized by the use of negative feedback.

Unfortunately, known arrangements tend to be relatively expensive.

SUMMARY OF THE INVENTION

This and other problems are solved with the instant current meter which includes a first voltage source for providing a first frequency signal to a single winding enclosing a magnetic core, the core being adapted to be coupled to the magnetic field surrounding a conductor, and apparatus responsive to the first voltage source for measuring the current through the conductor, the measuring apparatus including apparatus for minimizing a harmonic of the first frequency signal, the minimizing apparatus including (1) a second voltage source, (2) apparatus for extending a reference current from the second source through the winding, and (3) apparatus responsive to the reference current for detecting a minimal amplitude of the harmonic of the first frequency signal.

BRIEF DESCRIPTION OF DRAWING

Our invention should become fully apparent when taken in connection with the following detailed description and when taken in conjunction with the accompanying drawing which, in schematic form, shows an illustrative current meter arrangement in accordance with the principles of the present invention.

DETAILED DESCRIPTION

Referring to the FIGURE, conductor 400-1, which carries the unknown current to be measured, is situated within a core 200-1 of magnetic material. Core 200-1 may include, illustratively, a top half 210-1 and a bottom half 220-1. The core may be opened to receive conductor 400-1 and thereafter closed with a clip-on device (not shown) for joining the two halves and for reducing the air gap at the points of jointure. Winding 300-1, placed around one core half, e.g., around top half 210-1, is connected through a set of relay contacts 510-1 and 520-1 to cable 600. Cable 600 extends to current measuring meter arrangement 100. Additional cores, e.g., a total of N cores, may be jointly extended in parallel to cable 600. Any one of the N cores, and hence any one of N conductors, may be selected for measuring an unknown current by using core selector 500. Selector 500 may be a relay contact arrangement for closing one set of contacts (510-i, 520-i) and opening the remaining (N-1) sets of contacts. Thereby meter 100 can be used in a remote manner for measuring the unknown current in a selected one of N conductors.

Meter 100 includes ac voltage source 110, with internal impedance 111, for providing a fundamental frequency signal, e.g., a one volt r.m.s. 10 kilohertz signal, through primary windings 151 of transformer 150 thence over cable 600 onto the selected core winding for magnetically saturating core 200-1. Transformer 150 may have split secondary windings 152 and 153 interconnected by capacitor 154. Transformer 150 also matches ac source impedance 111 with the impedance of cable 600. As an aside and although not shown, when conductor 400-1 has zero current, symmetrical saturation of the magnetic field in the core obtains. Also, a third harmonic signal is produced. The amplitude of the third harmonic signal relative to the amplitude of the fundamental frequency signal may be used as a measure of the degree of core saturation. Continuing, as the unknown current flows in conductor 400-1, a magnetic field is produced around the conductor. The magnetic field magnetically biases the flux in core 200-1 creating a nonsymmetrical magnetic flux characteristic. As a result, a second harmonic signal, the amplitude of which varies with the magnitude of the unknown current in conductor 400-1, is produced. The second harmonic signal is reflected through transformer 150 and selected by bandpass filter 120. Filter 120, which is tuned to the second harmonic frequency, e.g., to 20 kilohertz, extends the second harmonic signal through amplifier 130, which introduces gain of about 50 dB, for measurement by galvonometer 140. Concurrently, dc voltage source 190, the polarity of which is phase sensitive both to the turn direction of winding 300-1 and to the direction of the current in conductor 400-1, provides a known dc reference current through winding 152 of transformer 150, closed relay contact 510-1, winding 300-1, closed relay contact 520-1, winding 153 of transformer 150, current limiting impedance 160, e.g., about 25,000 ohms, galvonometer 170, and variable impedance 180, e.g., variable between zero and 150,000 ohms, back to dc source 190. Source 190 could be any standard 24 volt dc battery. Adjustment of variable impedance 180 results in an adjustment of the dc current through winding 300-1. Hence, according to the principles of our invention, impedance 180 is adjustable to remove the core flux bias produced by the unknown current. As the flux bias is removed, the second harmonic, as indicated on galvonometer 140, is mitigated. Symmetry in the magnetic flux characteristic returns, and calibrated meter 170 indicates the unknown current carried in conductor 400-1. Thereby out improved current measuring arrangement substitutes a known dc reference current for the unknown current in the conductor and uses the dc reference current to indicate, by way of a calibrated meter, the current carried in the conductor.

We claim:

1. A current meter including a first voltage source (110) for providing a first frequency signal to a winding (300-1) enclosing a magnetic core (200-1), said core adapted to be coupled to the magnetic field surrounding a conductor (400-1), means responsive to said first frequency signal for measuring the current through said conductor, said measuring means including means (120) for detecting a harmonic of said first frequency signal, and means for reducing said detected harmonic and characterized in that said meter further comprises means adapting said meter for remotely measuring current through a plurality of conductors (400-1, . . .400-N), said remote measuring means including means (500, 510-1, . . .510-N, 520-1, . . .520-N) for selecting one of said conductors, means for extending said first frequency signal to a selected one of a plurality of windings (300-1, . . .300-N), said selected winding enclosing a selected one of a plurality of magnetic cores (200-1, . . .200-N), said selected core adapted to be coupled to the magnetic field surrounding said selected conductor, and said harmonic reducing means including a second voltage source (190), means (150, 600, 160) for extending a reference current from said second voltage source through said selected winding, and means (170) for displaying the magnitude of said reference current, means (180) for controlling the magnitude of said reference current, and means (140) for displaying the magnitude of said harmonic whereby the magnitude of said reference current equals the magnitude of the current in said selected conductor when said harmonic is minimized.

2. The meter defined in claim 1 wherein said second voltage source and said reference current extending means further comprises a dc current source for removing a magnetic bias in said selected core, said bias being introduced responsive to said current in said selected conductor whereby the magnitude of said dc current equals the magnitude of the current in said selected conductor.

* * * * *